US008778200B2

(12) United States Patent
Kubota et al.

(10) Patent No.: US 8,778,200 B2
(45) Date of Patent: Jul. 15, 2014

(54) METHOD FOR MANUFACTURING LIQUID DISCHARGE HEAD (75) Inventors: Masahiko Kubota, Tokyo (JP); Akihiko Okano, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 820 days.

(21) Appl. No.: 12/251,229

(22) Filed: Oct. 14, 2008

(65) Prior Publication Data

US 2009/0095708 A1  Apr. 16, 2009

(30) Foreign Application Priority Data

Oct. 16, 2007 (JP) ................................. 2007-268798
Dec. 6, 2007 (JP) ................................. 2007-315818

(51) Int. Cl.
*G01D 15/00* (2006.01)
*G11B 5/127* (2006.01)
*B81C 1/00* (2006.01)
*B41J 2/16* (2006.01)

(52) U.S. Cl.
CPC ................................. *B81C 1/00523* (2013.01); *B41J 2/1603* (2013.01)
USPC .............................................. 216/27; 216/2

(58) Field of Classification Search
CPC ...... B41J 2/1626; B41J 2/1628; B41J 2/1629; B41J 2/1639; B41J 2/162; B81C 1/00523; B81C 1/00531; B81C 1/00539
USPC ........................................................ 216/2, 27
See application file for complete search history.

(56) References Cited

U.S. PATENT DOCUMENTS

| 5,259,737 | A | * | 11/1993 | Kamisuki et al. | ................ | 417/322 |
| 5,658,471 | A | * | 8/1997 | Murthy et al. | .................. | 216/27 |
| 6,143,190 | A | * | 11/2000 | Yagi et al. | ........................ | 216/27 |
| 6,534,247 | B2 | | 3/2003 | Milligan | | |
| 2006/0057503 | A1 | * | 3/2006 | Bertelsen et al. | ............. | 430/320 |

FOREIGN PATENT DOCUMENTS

| JP | 11-099652 A | 4/1999 |
| JP | 2002-254647 A | 9/2002 |
| JP | 2004-087934 A | 3/2004 |
| JP | 2004-090573 A | 3/2004 |
| JP | 2004-517755 A | 6/2004 |
| JP | 2005-066994 A | 3/2005 |
| JP | 2006-062302 A | 3/2006 |
| JP | 2006-130742 | 5/2006 |
| JP | 2006-159893 A | 6/2006 |
| JP | 2007-160624 A | 6/2007 |
| JP | 2007-230234 A | 9/2007 |
| JP | 2007-261171 A | 10/2007 |

* cited by examiner

*Primary Examiner* — Nadine Norton
*Assistant Examiner* — Mahmoud Dahimene
(74) *Attorney, Agent, or Firm* — Cannon U.S.A., Inc. IP Division

(57) ABSTRACT

A method for manufacturing a liquid discharge head including a substrate on which supply ports for supplying a liquid are provided, includes forming a first supply port among the supply ports by performing crystal anisotropic etching on the substrate from one surface of the substrate, and forming a plurality of second supply ports among the supply ports by performing dry etching on the substrate using a crystal anisotropic etching method from a surface exposed toward the one surface of the substrate to a rear surface so that the independent second supply ports are respectively opened on the rear surface.

6 Claims, 7 Drawing Sheets

METHOD FOR MANUFACTURING LIQUID DISCHARGE HEAD

BACKGROUND OF THE INVENTION

1. Field of the Invention

The present invention relates to a method for manufacturing a liquid discharge head for discharging a liquid, more specifically, to a method for manufacturing an inkjet recording head for performing recording by discharging ink onto a recording medium.

2. Description of the Related Art

As an example of a liquid discharge head, Japanese Patent Application Laid-Open No. 2006-130742 discusses a discharge head in which a substrate having an energy generating element which generates energy used for discharging ink is provided with supply ports for supplying a liquid to the energy generating element. In Japanese Patent Application Laid-Open No. 2006-130742, in order to improve liquid supply performance, small apertures that go from a part having a large volume to a surface of the substrate are provided in supply ports penetrating the substrate from a rear surface to the front surface. Each of the small apertures is separately connected to a flow path.

U.S. Pat. No. 6,534,247 discusses a method for forming supply ports on a substrate as follows. The substrate is provided with a liquid discharge port on the front surface thereof and a flow path forming member that communicates with the discharge port. Wet etching is performed part of the way from a rear surface of the substrate toward the front surface of the substrate to form a recessed portion. The recessed portion serves as a large first supply port which is a part of supply ports. Subsequently, dry etching is performed on one surface forming the recessed portion that is exposed toward the rear surface of the substrate to form a second supply port. Thus, a supply port is formed which communicates the front surface with the rear surface of the substrate.

However, in the case of where the large recessed portion serving as a part of the supply ports is formed on the substrate and then the small supply port is formed by dry etching from the rear surface of the substrate as discussed in U.S. Pat. No. 6,534,247, the following problem can arise depending on the shape of the supply ports to be formed.

Namely, variations of etching rate appear within the substrate when performing the dry etching on the substrate to form the second supply port. For example, in the case where a plurality of the second supply ports is provided on the substrate, since progress of the etching on the second supply ports varies depending on etching positions in the substrate, formation of a recessed portion may be finished at one position while a recessed portion may be in the middle of formation at another position. In this case, if the etching is continued to carry on the processing of the supply port at another position, the supply port at the one position can be processed such that a sectional area becomes larger instead of being processed in a depth direction. In such a case, volumes of the second supply ports are different from each other in the liquid discharge head, and desired supply characteristics are not obtained in some cases.

SUMMARY OF THE INVENTION

The present invention is directed to a liquid discharge head having high accuracy of shape and favorable supply characteristics.

According to an aspect of the present invention, a method for manufacturing a liquid discharge head including a substrate on which supply ports for supplying a liquid is provided, includes forming a first supply port among the supply ports by performing crystal anisotropic etching on the substrate from one surface of the substrate and by removing 75% to 90% of a thickness of the entire substrate, and forming a plurality of independent second supply ports among the supply ports by performing dry etching on the substrate using a crystal anisotropic etching method from a surface exposed toward the one surface of the substrate to a rear surface so that the independent second supply ports are respectively opened on the rear surface.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute apart of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings.

The liquid discharge heads according to exemplary embodiments of the present invention is usable not only for an inkjet recording head but also for biochip production, electronic circuit printing, and the like.

First Exemplary Embodiment

Figure 1:
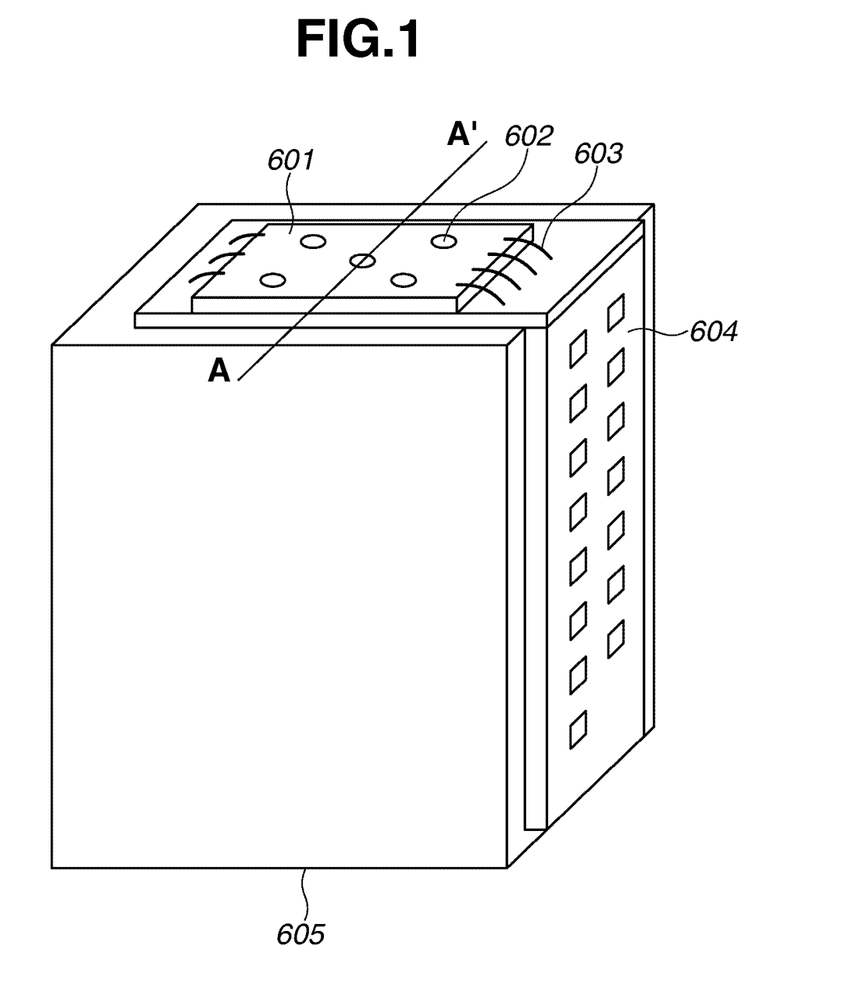
FIG. 1 is a perspective view illustrating an example of a liquid discharge head according to an exemplary embodiment of the present invention.

FIG. 1 is a perspective view illustrating an example of a liquid discharge head cartridge on which a liquid discharge head according to an exemplary embodiment of the present invention is mounted.

A tape automated bonding (TAB) film 604 sends/receives a recording signal to/from a main recording apparatus body. The TAB film 604 is provided on an outer surface of a holding member that detachably holds an ink tank 605. A liquid discharge head 601 having a plurality of discharge ports 602 is provided on the TAB film 604. The liquid discharge head 601 is connected to an electric wiring via an electrical connection lead 603.

FIGS. 2A to 2H are sectional views illustrating an example of a method for manufacturing the liquid discharge head according to the first exemplary embodiment, in which a section corresponding to a section of a substrate taken along the line A-A' of FIG. 1 is shown.

Figure 2A:
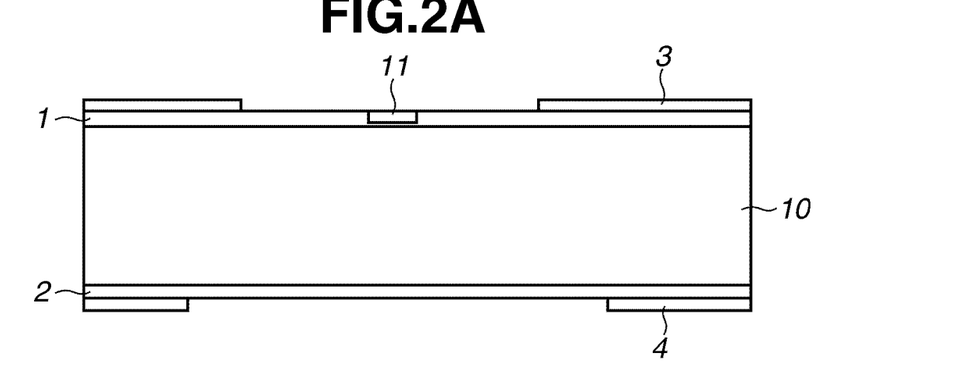
FIGS. 2A to 2H are sectional views illustrating an example of a method for manufacturing the liquid discharge head according to an exemplary embodiment of the present invention.

As illustrated in FIG. 2A, protection films 1 and 2 formed from a silicon oxide film are provided on a front surface and a rear surface of a substrate 10 formed from single crystal silicon and having a film thickness of 625 µm. Normally, a thickness of the substrate is approximately 625 µm or 725 µm. An energy generating element 11 for generating energy is provided. The generated energy is used for discharging a liquid onto the protection film 1 on the front surface. Polyether amide resins 3 and 4 which are thermoplastic resins are provided on the protection film 1 on the front surface and on the protection film 2 on the rear surface. The polyether amide resin 3 on the front surface also functions as an adhesion enhancing layer. The polyether amide resin 4 on the rear surface can function as a mask for etching. The polyether amide resins 3 and 4 can be formed by using, for example, HIMAL (product of Hitachi Chemical Co., Ltd.) and employing photolithography.

Figure 2B:
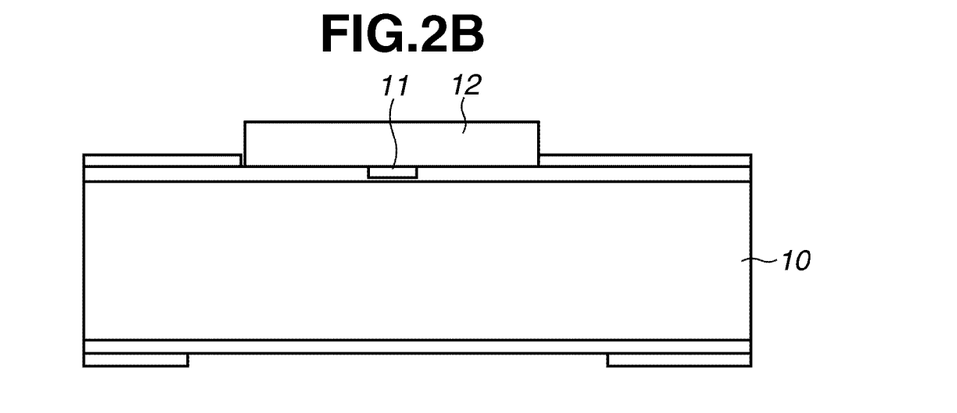

As illustrated in FIG. 2B, a layer of a positive photosensitive resin containing polymethyl isopropenyl ketone is formed by spin coating on one side of the substrate 10 on which the energy generating element 11 is provided. As polymethyl isopropenyl ketone, ODUR-1010 (trade name; product of Tokyo Ohka Kogyo Co., Ltd.) may be used. Subsequently, the positive photosensitive resin layer is exposed and developed by an exposure apparatus using light of an exposure wavelength of 230 to 350 nm to form a pattern 12 of the positive photosensitive resin layer that serves as a flow path.

Figure 2C:
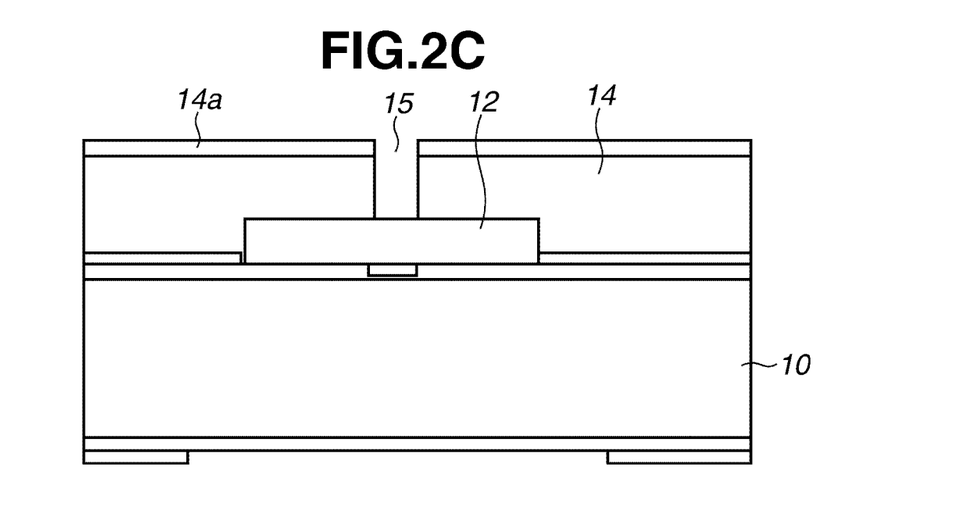

Next, as illustrated in FIG. 2C, a covering resin layer 14 is formed so as to cover the pattern 12, and a water repellent film 14a made from a photosensitive water repellent material is applied on the covering resin layer 14. After that, the covering resin layer 14 and the water repellent film 14a are collectively exposed and developed to form a discharge port 15. The covering resin layer 14 is a photosensitive material containing an epoxy resin as a main component. The photosensitive material can prevent compatible dissolution with the pattern 12 when the photosensitive material is dissolved into an aromatic solvent such as xylene and used for coating. For instance, the following compositions may be used for the water repellent film 14a. It is also possible to form the photosensitive water repellent layer by laminating.

|  | Weight Ratio |
|---|---|
| EHPE-3158 (trade name; product of Daicel Chemical Industries, Ltd.) | 34 |
| 2,2-bis(4-glycidyloxyphenyl)hexafluoropropane | 25 |
| 1,4-bis(2-hydroxyhexafluoroisopropyl)benzene | 25 |
| 3-(2-perfluorohexyl)ethoxy-1,2-epoxypropane | 16 |
| A-187 (trade name; product of Nippon Unicar Company Limited) | 4 |
| SP-170 (trade name; product of Asahi Denka Co., Ltd.) | 1.5 |
| Diethyleneglycolmonoethylether | 200 |

Figure 2D:
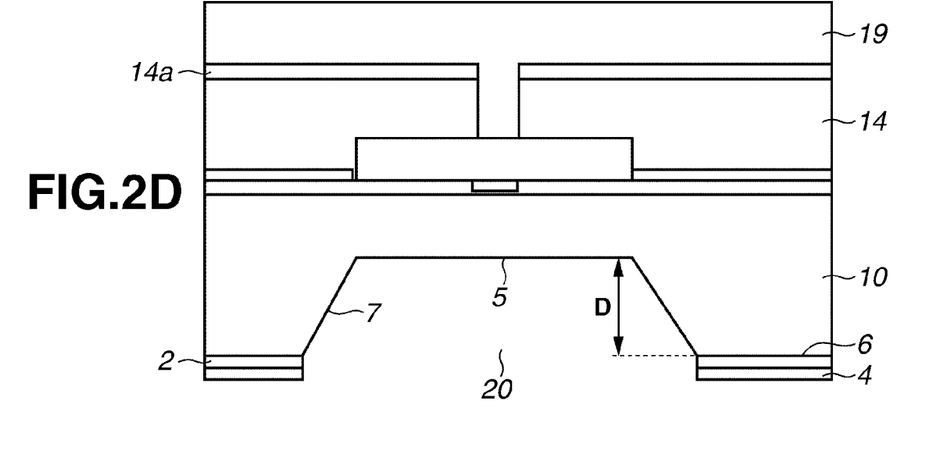

Next, a protection film 19 made from cyclized isoprene is formed to protect the covering resin layer 14 and the water repellent film 14a from an alkaline solution. Subsequently, a part of the protection film 2 is removed by using the polyether amide resin 4 on the rear surface of the substrate 10 as a mask, and is immersed in a 22 wt % solution of tetramethylammonium hydride (TMAH) at 83° C. for 12 hours to form a first supply port 20 among liquid supply ports. Thus, a state shown in FIG. 2D is achieved. In the case of using a substrate having a Si(100) surface as the substrate 10, a Si(100) surface 5 is exposed on aside of the rear surface 6. Also, a Si(111) surface 7 is exposed by the crystal anisotropic etching. In this case, it is advantageous to maintain a distance D from the rear surface 6 to the Si(100) surface 5 at 468 µm or more. More desirably, the distance D is 475 µm or more. When the thickness of the substrate 10 is 625 µm as in this embodiment, it is advantageous to maintain the distance D from the rear surface 6 to the Si(100) surface 5 at 75% or more of a thickness of the entire substrate 10. In the case where the thickness of the substrate 10 is 725 µm, it is advantageous to maintain the distance from the rear surface 6 to the Si(100) surface 5 at 80% or more of the thickness of the entire substrate 10. By maintaining such distances, it is possible to reduce a region on which dry etching is performed to form a second supply port in the post-process. Accordingly, even if a rate of the dry etching varies depending on the positions of the etching, the influence of the variation can be suppressed to be minor, so that the second supply port can be formed with accuracy.

Figure 2E:
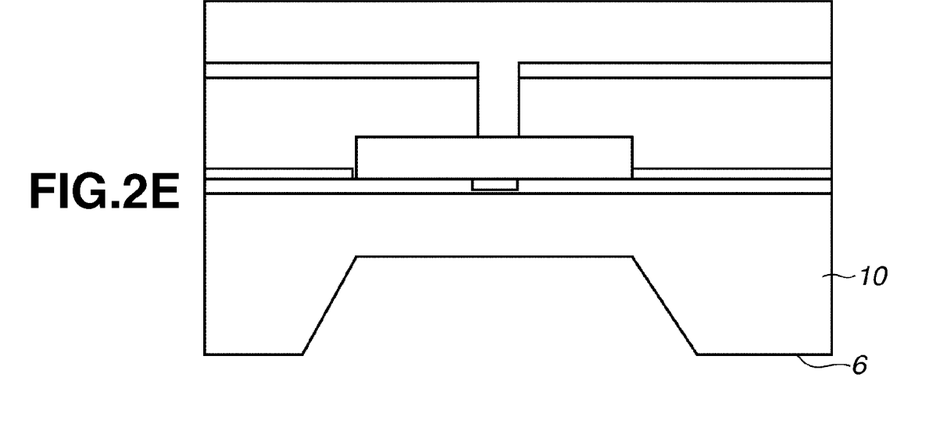

Next, as illustrated in FIG. 2E, the rear surface 6 of the substrate 10 is exposed by removing the protection film 2 and the polyether amide resin 4 from the rear surface 6.

Figure 2F:
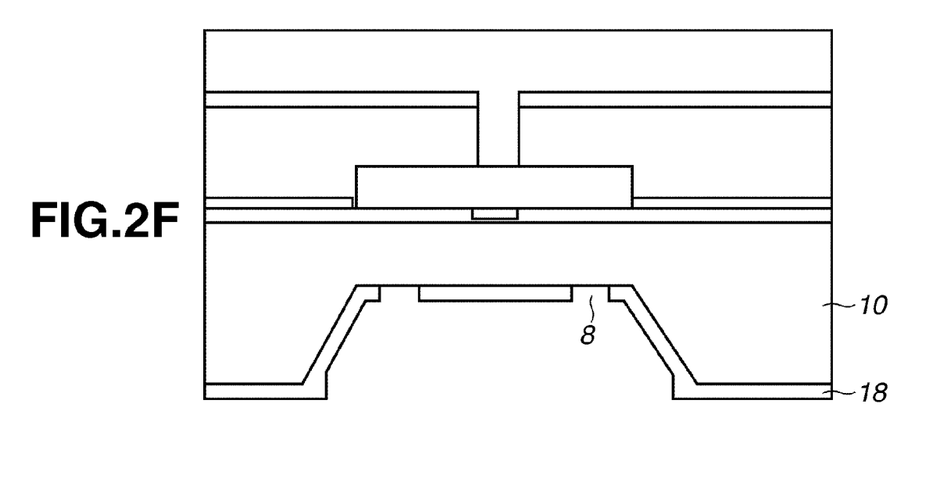

Next, as illustrated in FIG. 2F, a mask 18 formed from a photosensitive material layer is provided on the rear surface side of the substrate 10. The mask 18 is formed by spraying and applying the photosensitive material layer using a spraying apparatus (EVG150 which is manufactured by EV Group, etc.), and then by patterning. OFPR (trade name; product of Tokyo Ohka Kogyo Co., Ltd.) may be used as a photosensitive material to form the mask 18. As other examples of the photosensitive material, AZP4620 (trade name; product of AZ Electronic Materials) and BCB (trade name; product of Dow Corning Corporation) may be used. Since the rear surface 6 has been exposed in the above process, the mask 18 is formed over the Si(100) surface 5, the Si(111) surface 7 and the rear surface 6, so that good adhesion with the substrate 10 is achieved. Also, since the anisotropic etching slightly advances also toward the Si(111) surface, the rear surface protection film 2 serving as the mask for the anisotropic etching sometimes extends to the opening of the rear surface when the anisotropic etching is finished. In such a case, since there is a risk that the mask 18 cannot not be formed with good coating property, it is effective to remove the protection film 2 and the polyether amide resin 4 before the formation of the mask 18.

The mask 18 is provided with an opening 8 corresponding to the second supply port.

In a case where the opening 8 is formed by patterning, a projection type exposure apparatus as well as a proximity type exposure apparatus can be used without problems insofar as the apparatus can perform exposure with a desired pattern.

Figure 2G:
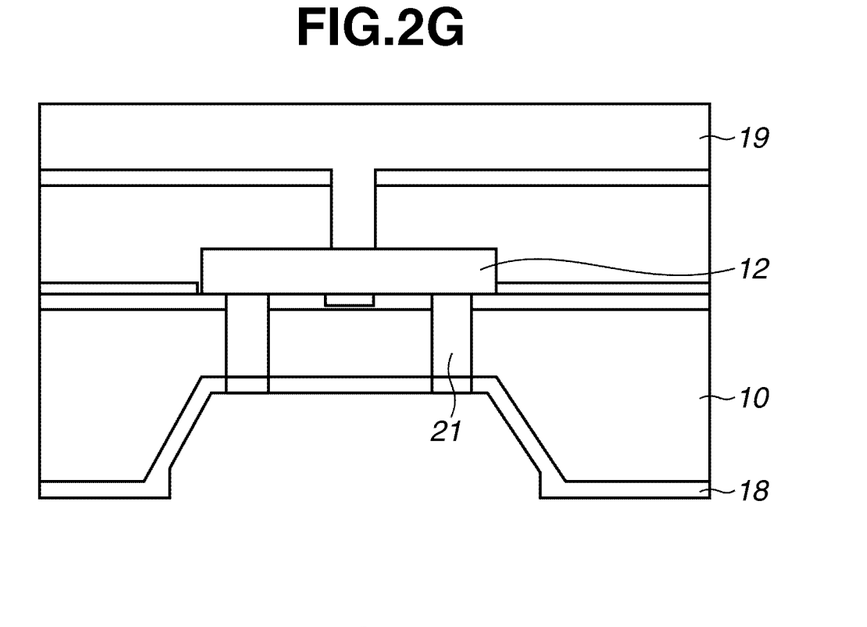

Next, as illustrated in FIG. 2G, the second supply port 21 is formed using the mask 18 and employing dry etching. As dry etching, applying voltage in gas atmosphere including fluorine and an etching method, known as what we call Bosch process, for repeating formation of a protective layer can be adopted, but it is not limited to these two methods. The second supply port 21 is formed so that the independent second supply ports are respectively opened on the surface of the substrate. A length of the second supply port 21 is from 75 to 156 µm. Since the thickness of the substrate 10 is 625 µm in the present exemplary embodiment, the dry etching with a thickness of 12% or more will be carried out. When the thickness subjected to the dry etching is 156 µm or less, more preferably 150 µm or less, it is possible to suppress an influence of distribution of the dry etching rates in the substrate 10 to be minor.

Figure 2H:
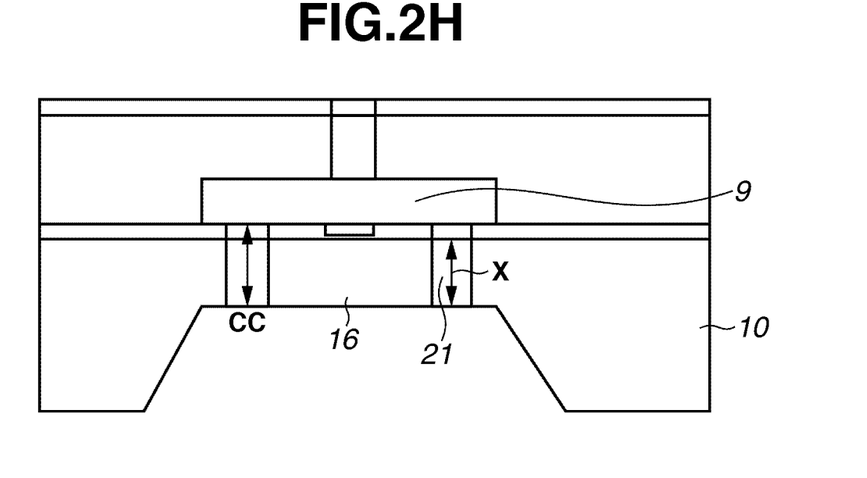

Subsequently, the substrate 10 is immersed in xylene to remove OBC. After that, the pattern 12 of the positive resist layer which is a mold material for a liquid flowpath is decomposed by whole surface exposure. When light having a wavelength of 330 nm or less is applied, the resist material is decomposed into a low molecular compound and is easily removable by a solvent. The positive resist layer which is the mold material for liquid flow path is removed by the solvent to form a flow path 9. Further, a beam portion 16 is formed with silicon between the adjacent second supply ports 21. Then, the mask 18 is removed and a state illustrated in FIG. 2H is achieved.

Figure 3:
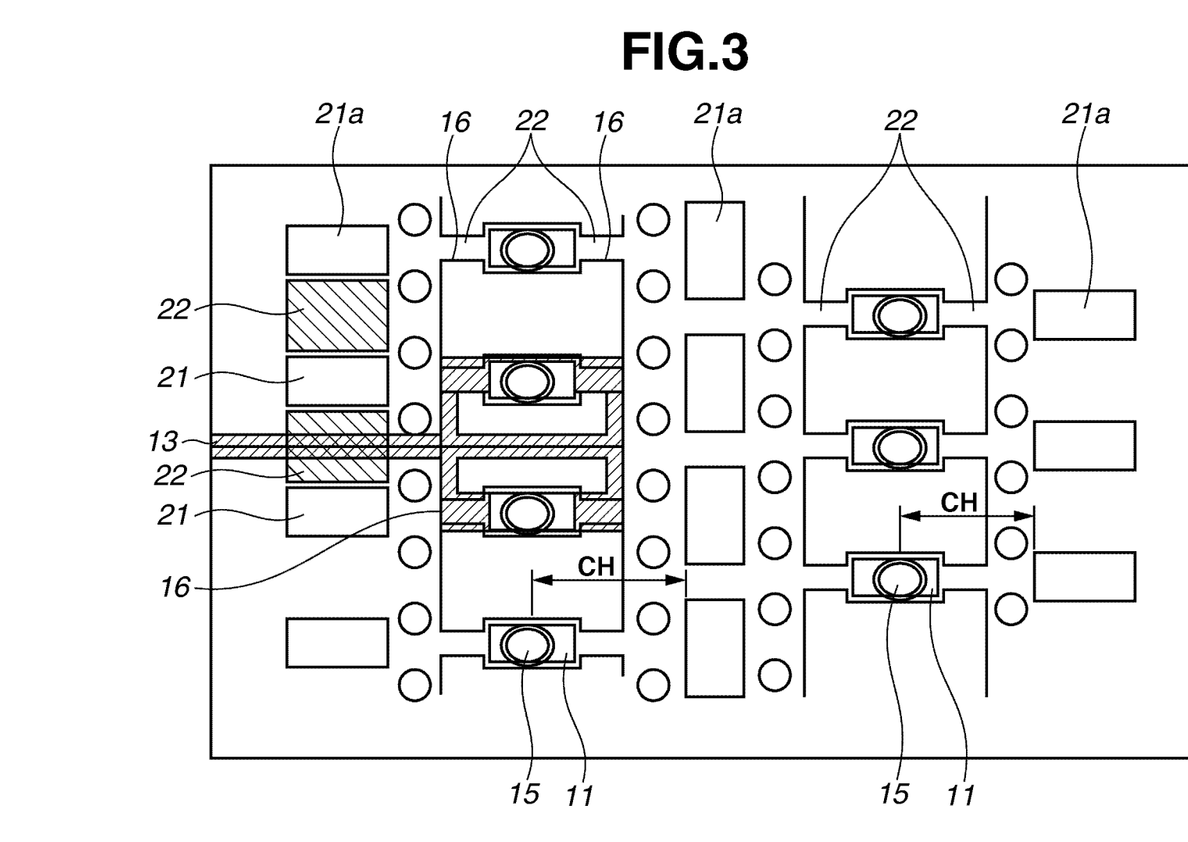
FIG. 3 is a view illustrating an example of a liquid discharge head according to an embodiment of the present invention.

FIG. 3 is a view illustrating an example of a liquid discharge head according to the exemplary embodiment of the present invention as viewed in a direction oriented from the discharge port to the substrate. Flow paths 22 are provided symmetrically on both sides of the energy generating element 11. A liquid is supplied from openings 21a of the second supply ports 21 on the front surface of the substrate to the energy generating element 11 via the flow paths 22.

The second supply port 21 is shaped such that its section parallel to the substrate is rectangular as shown in FIG. 3 or circular. As to a dimension, a maximum diameter is desirably 100 μm or less. By adopting such a diameter, flow path resistance at a supply port part is increased during discharge and a flow of a liquid in a direction of the discharge port can be stimulated as its effect.

In the opening 21a of the second supply port 21 on the substrate surface, a short side length X is about 40 to 50 μm and a long side length Y is about 80 to 100 μm.

A distance CH from the energy generating element 11 to the end of the closest second supply port 21 on the energy generating element side may desirably be smaller than a length CC (including a thickness such as the protection film 1) (FIG. 2H) of the second supply port 21 in a direction of the substrate thickness. The length of the second supply port is X, and X is obtained by subtracting D from the substrate thickness.

A wiring 13 is connected to the energy generating element 11 through the inside of the beam portion 16 to transmit a signal for driving the energy generating element 11. From the view point of strength of the beam 16, a thickness of the beam 16 is desirably about 75 μm or more. Therefore, it is desirable to leave 75 μm or more of the thickness of the substrate after forming the first supply port 20 in FIG. 2D. Therefore, when the thickness of the substrate 10 is 625 μm, a depth of the first supply port 20 is desirably 88% or less. When the thickness of the substrate 10 is 725 μm, a depth of the first supply port 20 is desirably 90% or less. As mentioned above, a depth of the first supply port 20 is desirably 75% to 90% of the thickness of the entire substrate 10.

Also, the heat quantity generated in the energy generating element 11 is communicated through the beam portion 16 and portions 22 between the second supply ports 21 in the substrate 10 to the entire substrate 10. Therefore, when an energy generating element is a heater, it is especially effective to have the thicknesses of the beam portion 16 and the portions 22 between the second supply ports 21 be 100 μm or more, since it becomes possible to control an increase of temperature near the energy generating element 11 in the substrate 10. Since it is possible to have the thicknesses of the beam portion 16 and the portions 22 between the second supply ports 21 be X, a depth of the second supply port 20 is desirably 100 μm to 156 μm of the thickness of the entire substrate 10. Furthermore, liquid is supplied from the first supply port 20 to the energy generating element 11 through the second supply port 21. Although it depends on the number of discharge ports or discharge frequency, in order to satisfy supplying of droplets discharged from a plurality of discharge ports 15, it is desirable to make X 150 μm or less to prevent the increase of the current resistance of the second supply port. Considering above, a depth of the second supply port 20 is desirably 100 μm to 150 μm of the thickness of the entire substrate 10. That is, it is desirable to leave 100 μm to 150 μm of the thickness of the substrate after forming the first supply port 20 in FIG. 2D.

Second Exemplary Embodiment

In the second exemplary embodiment, a flow path pattern is formed in a two-tier shape.

More specifically, the processes described referring to FIG. 2A in the first exemplary embodiment are first performed.

Figure 4:
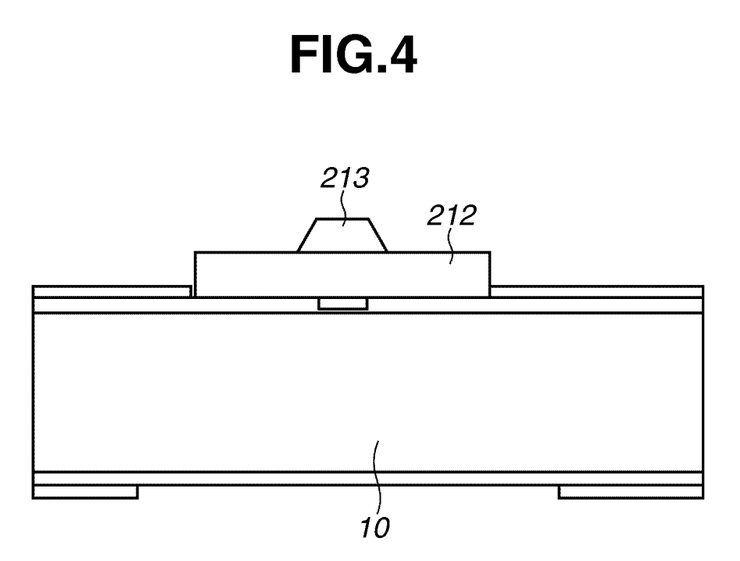
FIG. 4 is a sectional view illustrating an example of a method for producing a liquid discharge head according to an exemplary embodiment of the present invention.

Subsequently, as illustrated in FIG. 4, a pattern of a flow path having a lower layer 212 and an upper layer 213 is formed on the substrate 10. The lower layer 212 is made from polymethyl isopropenyl ketone described in the first exemplary embodiment. The upper layer 213 is made from positive resist mainly containing a methyl polymethacrylate-based copolymer.

Figure 5:
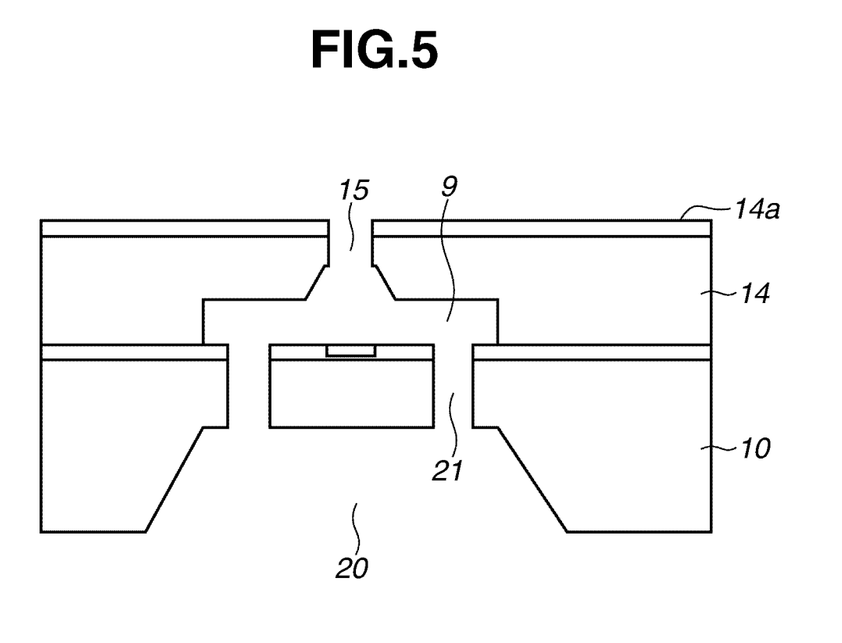
FIG. 5 is a sectional view illustrating an example of the liquid discharge head according to an embodiment of the present invention.

The subsequent processes are the same as the first exemplary embodiment, and a state illustrated in FIG. 5 is achieved by performing such subsequent processes.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-268798 filed Oct. 16, 2007 and Japanese Patent Application No. 2007-315818 filed Dec. 6, 2007, all of which are hereby incorporated by reference herein in their entirety.

What is claimed is:

1. A method for manufacturing a liquid discharge head including a liquid flow path forming member, a substrate on which first and second supply ports for supplying a liquid are provided, and an energy generating element that generates energy used for discharging the liquid, comprising:

providing the substrate having the energy generating element on a second surface of the substrate;

forming the first supply port, after the liquid flow path forming member is formed, by performing a crystal anisotropic etching on a first surface of the substrate that is a rear surface of the second surface of the substrate and by removing 75% to 90% of a thickness of the entire substrate, a <100> surface being exposed on a bottom surface of the first supply port; and forming a plurality of the second supply ports by performing a dry etching on the <100> surface of the substrate, the energy generating element being formed on the second surface of the substrate between two second supply ports among the plurality of the second supply ports.

2. The method according to claim 1, wherein in the step of forming the second supply ports, a section of the second supply ports parallel to the substrate is formed to have a maximum diameter of 100 μm or less.

3. The method according to claim 1, further comprising:

performing the crystal anisotropic etching using a first etching mask that includes an opening provided on the first surface of the substrate;

removing the first etching mask;

forming a second mask for the dry etching on the <100> surface of the substrate; and performing the dry etching using the second mask.

4. The method according to claim 3, wherein the second mask is formed by spraying a material forming the second mask onto the <100> surface of the substrate.

5. The method according to claim 1, wherein a distance from the energy generating element to an end of one second port of the second supply port on the energy generating element side is smaller than a length of the second supply port in a direction of substrate thickness.

6. The method according to claim 1, wherein a diameter of a section of the second supply ports parallel to the substrate is smaller than a diameter of the bottom surface of the first supply port.

* * * * *